US012603612B2

(12) United States Patent
Huang et al.

(10) Patent No.: US 12,603,612 B2
(45) Date of Patent: Apr. 14, 2026

(54) POWER SUPPLY CONTROL SYSTEM

(71) Applicant: Analog Devices International Unlimited Company, Limerick (IE)

(72) Inventors: Qingyi Huang, Shenzhen (CN); Qiping Wan, San Jose, CA (US)

(73) Assignee: Analog Devices International Unlimited Company, Limerick (IE)

( * ) Notice: Subject to any disclaimer, the term of this patent is extended or adjusted under 35 U.S.C. 154(b) by 263 days.

(21) Appl. No.: 18/137,116

(22) Filed: Apr. 20, 2023

(65) Prior Publication Data

US 2024/0213923 A1      Jun. 27, 2024

(30) Foreign Application Priority Data

Dec. 22, 2022    (WO) ................ PCT/CN2022/141096

(51) Int. Cl.
| | |
|---|---|
| *H03F 1/30* | (2006.01) |
| *H03F 1/02* | (2006.01) |
| *H03F 3/24* | (2006.01) |

(52) U.S. Cl.
CPC ........... *H03F 1/0227* (2013.01); *H03F 3/245* (2013.01); *H03F 2200/504* (2013.01)

(58) Field of Classification Search
CPC ................ H03F 1/30; H03F 3/20; H03G 3/30
USPC ........................................ 330/297, 296, 285
See application file for complete search history.

(56) References Cited

FOREIGN PATENT DOCUMENTS

| | | |
|---|---|---|
| DE | 202004005208 U1 | 8/2004 |
| EP | 3896855 A1 | 10/2021 |
| WO | WO-2004040761 A1 | 5/2004 |
| WO | WO-2022031276 A1 | 2/2022 |

OTHER PUBLICATIONS

"European Application Serial No. 23213115.1, Extended European Search Report mailed Jul. 16, 2024", 15 pgs.
"European Application Serial No. 23213115.1, Partial European Search Report mailed May 15, 2024", 15 pgs.
"European Application Serial No. 23213115.1, Response filed Sep. 27, 2024 to Extended European Search Report mailed Jul. 16, 2024", 20 pgs.
Qian, Jin, "Optimized Design of GaN Switched-Capacitor-Converter-Based Envelope Tracker for Satellite Application", IEEE Journal of Emerging and Selected Topics in Power Electronics, 5(3), (Sep. 2017), 1346-1355.

*Primary Examiner* — Henry Choe
(74) *Attorney, Agent, or Firm* — Schwegman Lundberg & Woessner, P.A.

(57) ABSTRACT

In an example a power supply control system for switchably routing at least a first power supply voltage to an output voltage supply node may include a first compound switch circuit. The first compound switch circuit may include a first field effect transistor (FET), where a drain of the first FET may be connected to the first power supply voltage. The first compound switch circuit may also include a second FET, where a source of the second FET may be connected to a source of the first FET, where a drain of the second FET may be connected to the output voltage supply node, where a gate of the first FET and a gate of the second FET may be connected together to form a first shared source node. The power supply control system may also include first voltage driving circuitry which may drive an "on" gate-to-source voltage level.

15 Claims, 6 Drawing Sheets

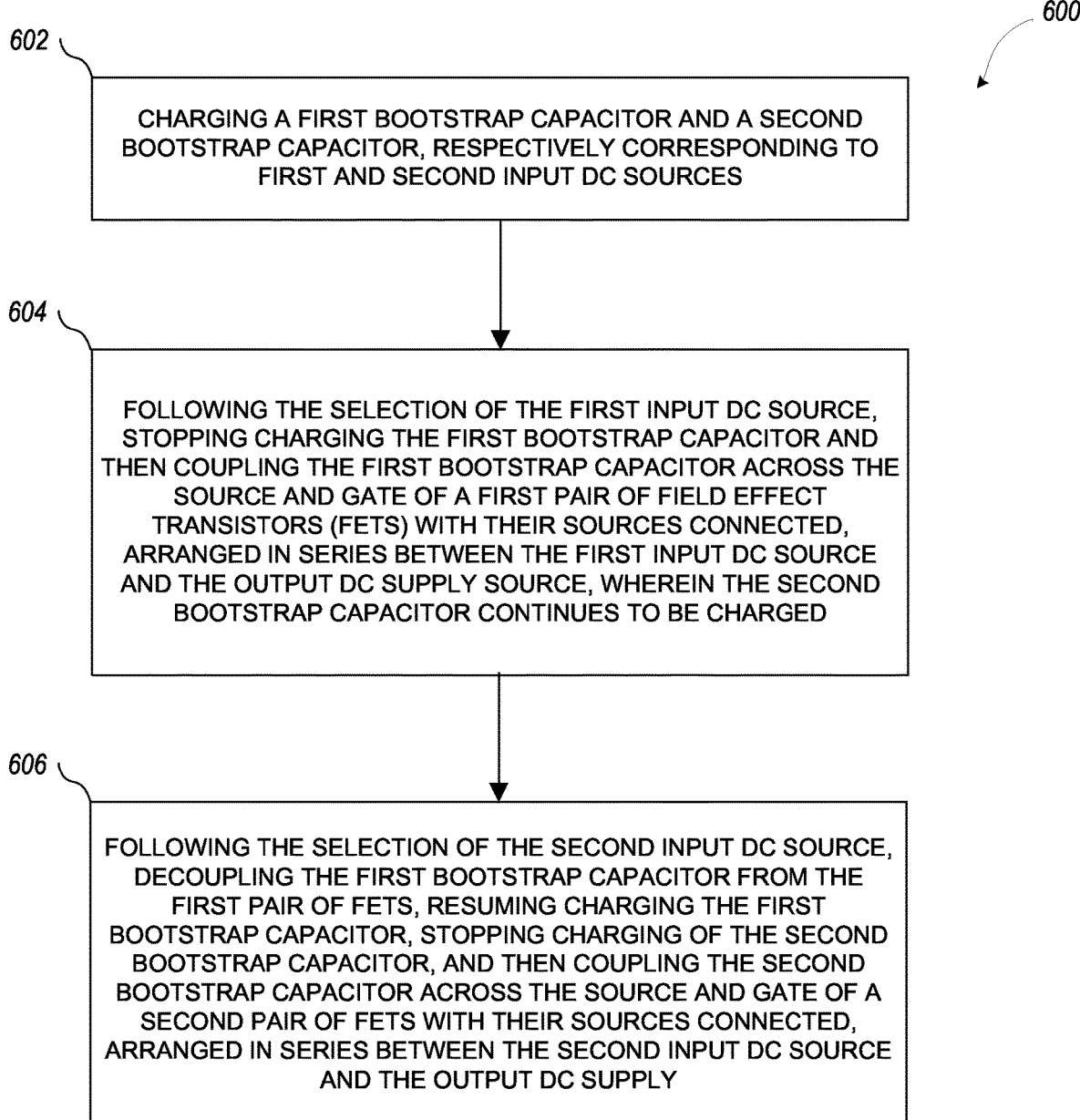

602

CHARGING A FIRST BOOTSTRAP CAPACITOR AND A SECOND BOOTSTRAP CAPACITOR, RESPECTIVELY CORRESPONDING TO FIRST AND SECOND INPUT DC SOURCES

604

FOLLOWING THE SELECTION OF THE FIRST INPUT DC SOURCE, STOPPING CHARGING THE FIRST BOOTSTRAP CAPACITOR AND THEN COUPLING THE FIRST BOOTSTRAP CAPACITOR ACROSS THE SOURCE AND GATE OF A FIRST PAIR OF FIELD EFFECT TRANSISTORS (FETS) WITH THEIR SOURCES CONNECTED, ARRANGED IN SERIES BETWEEN THE FIRST INPUT DC SOURCE AND THE OUTPUT DC SUPPLY SOURCE, WHEREIN THE SECOND BOOTSTRAP CAPACITOR CONTINUES TO BE CHARGED

606

FOLLOWING THE SELECTION OF THE SECOND INPUT DC SOURCE, DECOUPLING THE FIRST BOOTSTRAP CAPACITOR FROM THE FIRST PAIR OF FETS, RESUMING CHARGING THE FIRST BOOTSTRAP CAPACITOR, STOPPING CHARGING OF THE SECOND BOOTSTRAP CAPACITOR, AND THEN COUPLING THE SECOND BOOTSTRAP CAPACITOR ACROSS THE SOURCE AND GATE OF A SECOND PAIR OF FETS WITH THEIR SOURCES CONNECTED, ARRANGED IN SERIES BETWEEN THE SECOND INPUT DC SOURCE AND THE OUTPUT DC SUPPLY

*FIG. 6*

POWER SUPPLY CONTROL SYSTEM

CLAIM OF PRIORITY

This patent application claims the benefit of priority of Huang et al. Patent Cooperation Treaty (PCT) Application filed in the China Intellectual Property Office as the PCT Receiving Office, PCT application Serial Number: PCT/CN2022/141096, entitled "POWER SUPPLY CONTROL SYSTEM," filed on Dec. 22, 2022, which is hereby incorporated by reference herein in its entirety.

TECHNOLOGICAL FIELD

The present disclosure relates to electronics, and more particularly, but not by way of limitation, to a power supply control system that can switchably route one or more input power supplies to an output supply node.

BACKGROUND

Modern systems can use power supplies to generate voltages and currents for power circuits, sensors, transmitters, and receivers. Examples of such modern systems include communication systems, radar systems, and electromagnetic transmission systems. The voltage and current of the power supply may be selected to match a system design or a system operating condition.

SUMMARY

A power supply may be used to provide the input power or bias level for a power amplifier (PA). The bias level may include one or more of a voltage or a current applied to a transistor-based amplifier. The bias level may be used to amplify an incoming signal level to provide a specified outgoing signal level. The present inventors have recognized, among other things, that for a specified outgoing signal level, a specified bias level may be desired. Providing a bias level that is larger than desired may result in one or more of decreasing the efficiency of the PA, increasing the temperature of the PA, or increasing the load on the power supply providing the bias level. The bias level may be adjusted or modulated to more closely match a desired bias level for a given outgoing signal level. This document describes, among other things, a system for controlling one or more power supplies.

In an example a power supply control system for switchably routing at least a first power supply voltage to an output voltage supply node may include a first compound switch circuit. The first compound switch circuit may include a first field effect transistor (FET), where a drain of the first FET may be connected to the first power supply voltage. The first compound switch circuit may also include a second FET, where a source of the second FET may be connected to a source of the first FET, where a drain of the second FET may be connected to the output voltage supply node, where a gate of the first FET and a gate of the second FET may be connected together to form a first shared source node. The power supply control system may also include first voltage driving circuitry which may drive an "on" gate-to-source voltage level of the first compound switch above a turn-on gate-to-source voltage of the first and second FETs when the first compound switch is to be placed in an "on" state. The power supply control system may also include a first bootstrap capacitor, which may be configured to be pre-charged to a second power supply voltage when the first compound switch is in an "off" state, and configured to provide the second power supply voltage as the "on" gate-to-source voltage level to the first voltage driving circuitry when the first compound switch is to be placed in the "on" state.

In an example a circuit for biasing a power amplifier (PA) may include a DC power supply, where the DC power supply may provide two or more DC voltage levels. The circuit may also include a DC switch system for switchably routing one of the two or more DC voltage levels at a time to an output voltage supply node. The DC switch system may include a switch circuit for each of the two or more DC voltage levels, the switch circuit for each DC voltage level may include a compound switch circuit. The compound switch circuit may include a first field effect transistor (FET), where a drain of the first FET may be connected to a respective DC voltage level. The compound switch circuit may also include a second FET, where a source of the second FET may be connected to a source of the first FET, where a drain of the second FET may be connected to the output voltage supply node, where a gate of the first FET and a gate of the second FET may be connected together to form a first shared source node. The switch circuit may also include voltage driving circuitry which may drive an "on" gate-to-source voltage level of the compound switch above a turn-on gate-to-source voltage of the first and second FETs when the compound switch is to be placed in an "on" state. The switch circuit may also include a bootstrap capacitor, which may be configured to be pre-charged to a bootstrap charging power supply voltage when the first compound switch is in an "off" state, and may be configured to provide the bootstrap charging power supply voltage as the "on" gate-to-source voltage level to the voltage driving circuitry when the compound switch is to be placed in the "on" state.

In an example a method for selecting between two or more input DC sources for an output DC supply may include charging a first bootstrap capacitor and a second bootstrap capacitor, respectively corresponding to a first input DC source and a second input DC sources. The method may also include following the selection of the first input DC source, stopping charging the first bootstrap capacitor and then coupling the first bootstrap capacitor across the source and gate of a first pair of field effect transistors (FETs) with their sources connected, arranged in series between the first input DC source and the output DC supply, where the second bootstrap capacitor continues to be charged. The method may also include following the selection of the second input DC source, decoupling the first bootstrap capacitor from the first pair of FETs, resuming charging the first bootstrap capacitor, stopping charging of the second bootstrap capacitor, and then coupling the second bootstrap capacitor across the source and gate of a second pair of FETs with their sources connected, arranged in series between the second input DC source and the output DC supply.

BRIEF DESCRIPTION OF THE DRAWINGS

FIG. 6 is a flow chart showing an example of a method for operating portions of a power supply control system.

DETAILED DESCRIPTION

Figure 1:
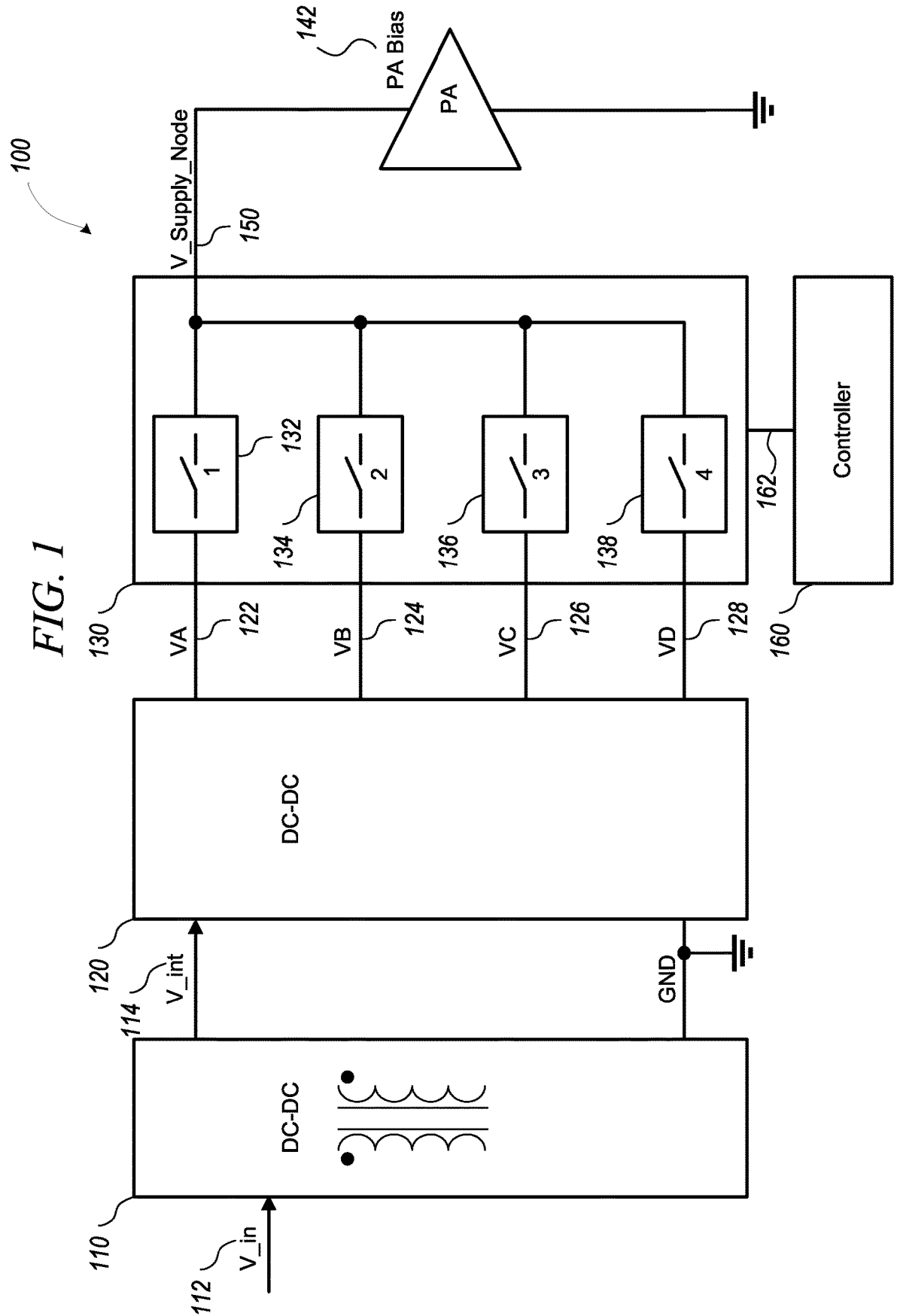
FIG. 1 is a schematic drawing of an example of portions of a power supply control system and an example of portions of a system in which the power supply control system can be used.

The present disclosure relates to a system that can control one or more power supplies.

A system for switchably selecting between one or more power supplies may be used to bias a PA, such as a PA used in wired or wireless communication. For example, a cellular communication system may break communication into symbols, or individual packets, and the symbols may have a specified power level. The PA power supply bias level may be modulated or changed to accommodate the symbol power in symbol-based envelope tracking (SBET). For example, the PA power supply bias level may be increased to match a specified symbol power of a particular symbol being communicated, or decreased to conserve energy when a particular symbol power is lower.

In an SBET system, it may be desirable to achieve a fast switching speed or a high switching frequency. When an SBET switch system has a lower than desirable frequency, communication errors or lower efficiency may result.

In a system for switchably selecting between one or more power supplies for output, such as may be used to bias a PA, it may be desirable to couple one or more power supplies to the output while decoupling one or more other power supplies from the output. A field effect transistor (FET) may be used as a switch to couple and decouple the one or more power supplies, such as to bias the PA. The FET may be a high-side FET with one or more of the drain or source connected to the voltage level provided by a power supply. The provided voltage level may be higher than the ground potential. In order to turn on the high-side FET, it may be desirable to generate a voltage larger than the provided voltage level to apply to the gate of the high-side FET to turn on the FET. The FET may not be able to be turned on with a voltage level equal to or less than the provided voltage level due to the high-side configuration.

In an approach, a charge pump may be used to generate the additional voltage to turn on the FET. The charge pump may be one or more of large, power-hungry, or expensive. The charge pump may not produce a current large enough to switch the FET as fast as is desirable.

In an approach, an isolated power supply may be used to generate the additional voltage to turn on the FET. The isolated power supply may be one or more of large, power-hungry, or expensive. The isolated power supply may not be able to be shared between more than one of a group of switching FETs, which may result in the desire for multiple isolated power supplies, which may further add to the size, weight, power consumption, or expense of the system.

In an approach, a drive transformer may be used to generate the additional voltage to turn on the FET. The drive transformer may be one or more of large, heavy, or expensive. The drive transformer may not be able to be shared between more than one of a group of switching FETs, which may result in the desire for multiple drive transformers, which may further add to the size, weight, or expense of the system.

A FET may not provide the desired reverse current blocking to prevent one or more voltages on the output from generating a current backward through the FET to the power supply connected to the FET. In an approach, a diode may be used to block the reverse current. The diode may have a turn-on voltage, such as may include 0.7V, which may result in a voltage drop across the diode in the "on" condition and a corresponding power loss and inefficiency that may be additional to power losses and inefficiencies elsewhere in the system.

The present inventors have recognized, among other things, that a system for switchably selecting between one or more power supplies for output may include or consist of one or more switch circuits. The switch circuits may include a pair of back-to-back FETs such as to provide forward and reverse current blocking when the FETs are in an off state. The system may include circuitry for charging a bootstrap capacitor using a non-isolated power supply. The charged bootstrap capacitor may be coupled between the gate and source of the back-to-back FETs to provide the desired gate-to-source voltage to turn the FETs on. The non-isolated power supply may be able to be shared between one or more switch circuits, and may be used to charge one or more bootstrap capacitors.

FIG. 1 is a schematic drawing of an example of portions of a power supply control system 130 and an example of portions of a system 100 in which the power supply control system can be used 100. In the example of FIG. 1, the system 100 may include an isolated DC-DC power supply 110, a non-isolated DC-DC converter 120, a power supply control system 130, a controller 160, and a power amplifier (PA) 140.

The isolated DC-DC power supply 110 may accept an input voltage V_in at input node 112, and may generate an intermediate voltage V_int at intermediate node 114. The isolated DC-DC power supply 110 may have a ground reference pin. The isolated DC-DC power supply 110 may convert a DC input voltage, such as may be −48V, at input node 112 to a DC intermediate voltage, such as may be +48V, at intermediate node 114. The isolated DC-DC power supply 110 may provide galvanic electrical isolation between the input node 112 and the intermediate node 114.

The non-isolated DC-DC converter 120 may accept an intermediate voltage at intermediate node 114 as an input and may generate one or more outputs such as may include a VA node 122, a VB node 124, a VC node 126, and a VD node 128. The non-isolated DC-DC converter 120 may include or be connected to a ground reference pin. The ground reference pin may be shared by the input and one or more of the outputs of the the non-isolated DC-DC converter 120. This may result in the input and one or more of the outputs of the non-isolated DC-DC converter 120 not being galvanically electrically isolated. The non-isolated DC-DC converter 120 may convert the intermediate voltage at node 114 into the one or more outputs, such as by using one or more solid-state circuits, power electronics, switching converters, transformers, or other hardware componentry. The non-isolated DC-DC converter 120 may be controlled by internal or external software, or may include hardwired circuit functionality. The voltage levels generated by the non-isolated DC-DC converter 120 may include one or more of 8V, 16V, 24V, 32V, 40V, or 48V. In an example VA node 122 is operated at 48V, VB node 124 is operated at 40V, VC node 126 is operated at 32V, and VD node 128 is operated at 24V.

The power supply control system 130 may accept as inputs one or more voltage levels, such as may include respective voltage levels at VA node 122, VB node 124, VC node 126, and VD node 128. The power supply control system 130 may include one or more switch circuits, such as may include a first switch circuit 132, a second switch circuit 134, a third switch circuit 136, and a fourth switch circuit 138. The power supply control system 130 may switchably route one or more of the inputs to the output voltage supply node 150. The power supply control system 130 may route a selected one of the inputs to the output voltage supply node 150. The power supply control system 130 may be used for biasing a PA, such as a PA included or used in a communication system.

The first switch circuit 132 may be connected between the VA node 122 and the output voltage supply node 150. The second switch circuit 134 may be connected between the VB node 124 and the output voltage supply node 150. The third switch circuit 136 may be connected between the VC node 126 and the output voltage supply node 150. The fourth switch circuit 138 may be connected between the VD node 128 and the output voltage supply node 150.

The controller 160 may be connected to the power supply control system 130 such as by a controller bus 162. The controller 160 may provide one or more analog or one or more digital signals to the power supply control system 130 such as to control operation of the power supply control system 130. The controller 160 may be configured to select between the one or more voltage levels for switchably routing to the output voltage supply node 150. The controller 160 may be connected to one or more other circuits. The controller 160 may process internal data or data from the one or more other circuits such as to determine which voltage level to route to the output voltage supply node 150. In an example, the controller 160 may receive information regarding an encoded communication symbol to be transmitted, may determine a PA power supply bias input 142 level based upon the symbol power of that symbol, and may signal the power supply control system 130 to output the desired voltage level.

The PA 140 may include a PA power supply bias input 142 and a ground reference. The PA power supply bias input 142 may be electrically connected to the output voltage supply node 150. The PA 140 may be used as a signal amplifier, such as may include a signal amplifier in a cellular or other communication transmitter. The PA 140 may include a transistor-based amplifier such as using a bipolar junction transistor (BJT) or FET. The PA 140 may include an arrangement of one or more transistors such as may include one or more BJTs or one or more FETs. The PA power supply bias input 142 may provide the power that is used to amplify a lower power signal from a processor circuit to a higher power signal for transmitting. The PA power supply bias input 142 level may be specified or selected based upon a value of a symbol to be transmitted or communicated, and the associated power level desired for communicating that particular symbol.

Figure 2:
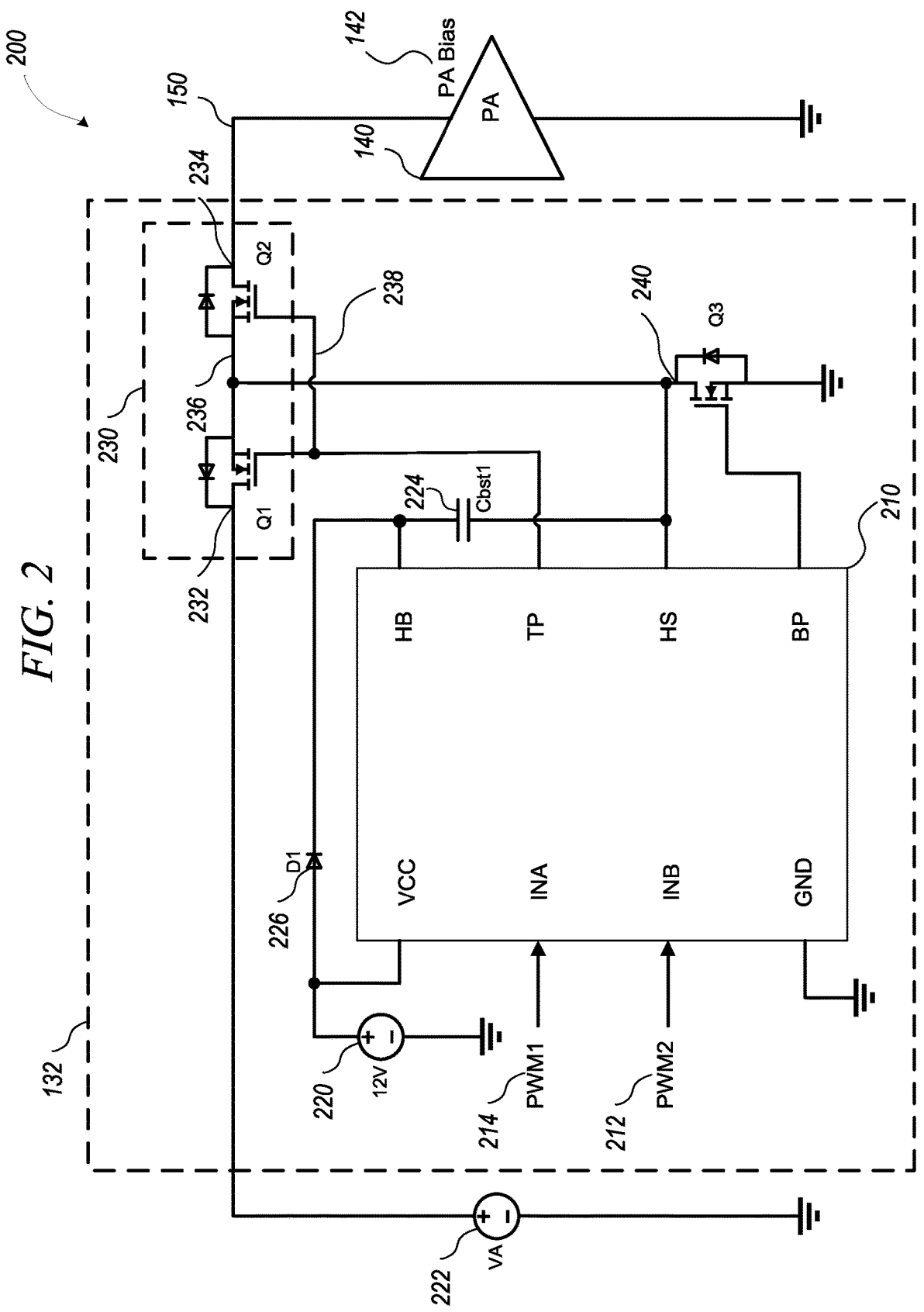
FIG. 2 is a schematic drawing of an example of portions of a power supply control system and an example of portions of a system in which the power supply control system can be used.

FIG. 2 is a schematic drawing 200 of an example of portions of a power supply control system 130 and an example of portions of a system 100 in which the power supply control system can be used. In the example of FIG. 2, the system 100 may include a first power supply 222, a first switch circuit 132, and a PA 140.

The first switch circuit 132 may include a first compound switch circuit 230, first voltage driving circuitry 210, a second power supply 220, a first diode 226, a first bootstrap capacitor 224, and a first DC switching device 240. The first compound switch circuit 230 may include a first field effect transistor (FET) 232 and a second FET 234. A source of the first FET 232 and a source of the second FET 234 may be connected together to form a first shared source node 236. A gate of the first FET 232 and a gate of the second FET 234 may be connected together to form a first shared gate node 238.

A drain of the first FET 232 may be connected to the first power supply 222. A drain of the second FET 234 may be connected to the output voltage supply node 150. The first FET 232 and the second FET 234 may be any type of field effect transistor, such as may include a metal oxide semiconductor field effect transistor (MOSFET) a junction field effect transistor (JFET) or other similar transistor device. The first FET 232 and the second FET 234 may include one or more configurations, such as may include a p-channel construction or an n-channel construction.

The first FET 232 and the second FET 234 may be one or more of depletion mode FETs or enhancement mode FETS. In a depletion mode FET, the transistor may be normally on, allowing current to flow between the drain and source, when the gate-to-source voltage is low, such as 0V. A gate-to-source voltage may be applied to turn off the depletion mode transistor. In an enhancement mode FET, the transistor may be normally off, blocking current between the drain and source, when the gate-to-source voltage is below a turn-on voltage. A gate-to-source voltage above the "on" gate-to-source voltage may be applied to turn on the transistor. The "on" gate-to-source voltage may be based on one or more of the physics of the semiconductor materials, or the configuration of the semiconductor materials, such as may include one or more of doping levels or transistor dimensions. In an example, the first FET 232 and the second FET 234 may be enhancement mode n-channel FETs with an "on" gate-to-source voltage of less than 12V. The first FET 232 and the second FET 234 may be constructed such that the resistance between the drain and source when they are on is low, such as may include 0.5 ohms, 0.1 ohms, 0.01 ohms, 0.001 ohms, or 0.0001 ohms.

The first voltage driving circuitry 210 may charge the first bootstrap capacitor 224 to the voltage of the second power supply 220 through the first diode 226 by turning on or modulating the first DC switching device 240. Following the charging of the first bootstrap capacitor 224, the first voltage driving circuitry 210 may stop charging the first bootstrap capacitor 224 and may then couple the first bootstrap capacitor 224 between the first shared source node 236 and the first shared gate node 238 to provide the "on" gate-to-source voltage of the first compound switch circuit 230. In an example, the first voltage driving circuitry 210 may include a half-bridge driver.

The first voltage driving circuitry 210 may include a supply voltage input VCC, a ground reference GND, a first pulse-width modulation signal 214 input INA, a second pulse-width modulation signal 212 input INB, a high-side source connection HS, a high-side bootstrap capacitor connection HB, a high side gate output TP, and a low side gate output BP. The first voltage driving circuitry 210 may electrically connect VCC to BP in response to INB being high. The first voltage driving circuitry 210 may electrically connect HB to TP in response to INA being high.

The second power supply 220 may produce a DC voltage, e.g., 12V. The second power supply 220 may be an isolated power supply that is not referenced to a ground potential, or it may be a non-isolated power supply that is referenced to ground. The first power supply 222 and the second power supply 220 may share a common ground reference. The first power supply 222 may produce the same voltage as the second power supply 220 or different voltages. In an example, the first power supply 222 and the second power supply 220 are a single DC power supply.

The first diode 226 may be a semiconductor-based diode, such as may include a p-type/n-type junction. The first diode 226 may be configured to block current from the first shared source node 236 from traveling through the first bootstrap capacitor 224 through the second power supply 220. This may help keep the first bootstrap capacitor 224 charged to provide the "on" gate-to-source voltage to the first compound switch circuit 230. The first diode 226 may be configured to block a voltage that is greater than or equal to the voltage of the first power supply 222.

The first bootstrap capacitor 224 may be configured to operate at a voltage equal or greater to the voltage of the second power supply 220. The capacitance of the first bootstrap capacitor 224 may be selected to limit current from the second power supply 220 through the first diode 226 and through the first DC switching device 240. The capacitance of the first bootstrap capacitor 224 may be selected to allow the first bootstrap capacitor 224 to provide the "on" gate-to-source voltage of the first compound switch circuit 230 for a desired length of time without recharging. A higher gate leakage current of the first FET 232 and the second FET 234 may be accommodated by a larger-capacitance first bootstrap capacitor 224. In an example, the capacitance value of the first bootstrap capacitor 224 may be 1 picofarad, 10 picofarads, 100 picofarads, 1 nanofarad, 10 nanofarads, 100 nanofarads, 1 microfarad, or 10 microfarads.

The first DC switching device 240 may include a semiconductor-based solid-state switch, such as may include a FET. A source of the first DC switching device 240 may be connected to ground. A drain of the first DC switching device 240 may be connected to the first shared source node 236, which may be connected to the HS terminal of the first voltage driving circuitry 210. A gate of the first DC switching device 240 may be connected to the BP terminal of the first voltage driving circuitry 210. The first DC switching device 240 may be turned on by the first voltage driving circuitry 210, such as by the first voltage driving circuitry 210 connecting VCC to BP in response to a high signal on INB. The first DC switching device 240 may be modulated by the second pulse-width modulation signal 212. This may help reduce a peak or an average current. The first DC switching device 240 may be of a small size as compared to a drive transformer or isolated power supply. The first DC switching device 240 may be able to be reduced in size if the capacitance value of the first bootstrap capacitor 224 is reduced.

The first pulse-width modulation signal 214 and the second pulse-width modulation signal 212 may be received from a controller 160 through a controller bus 162. The second pulse-width modulation signal 212 may be controlled to control charging of the first bootstrap capacitor 224. The first pulse-width modulation signal 214 may be controlled to turn on the first compound switch circuit 230.

One or more of the power supply control system 130 or the first switch circuit 132 may be able to be constructed, at least in part, using available components, such as may include FETs, capacitors, power supplies, and half-bridge drivers. This may one or more of allow the power supply control system 130 to be constructed more economically than a system made of custom components, may allow the power supply control system 130 to be constructed more quickly than a system made of custom components, or may help improve reliability of the power supply control system 130 as compared to a system made of custom components.

Figure 3:
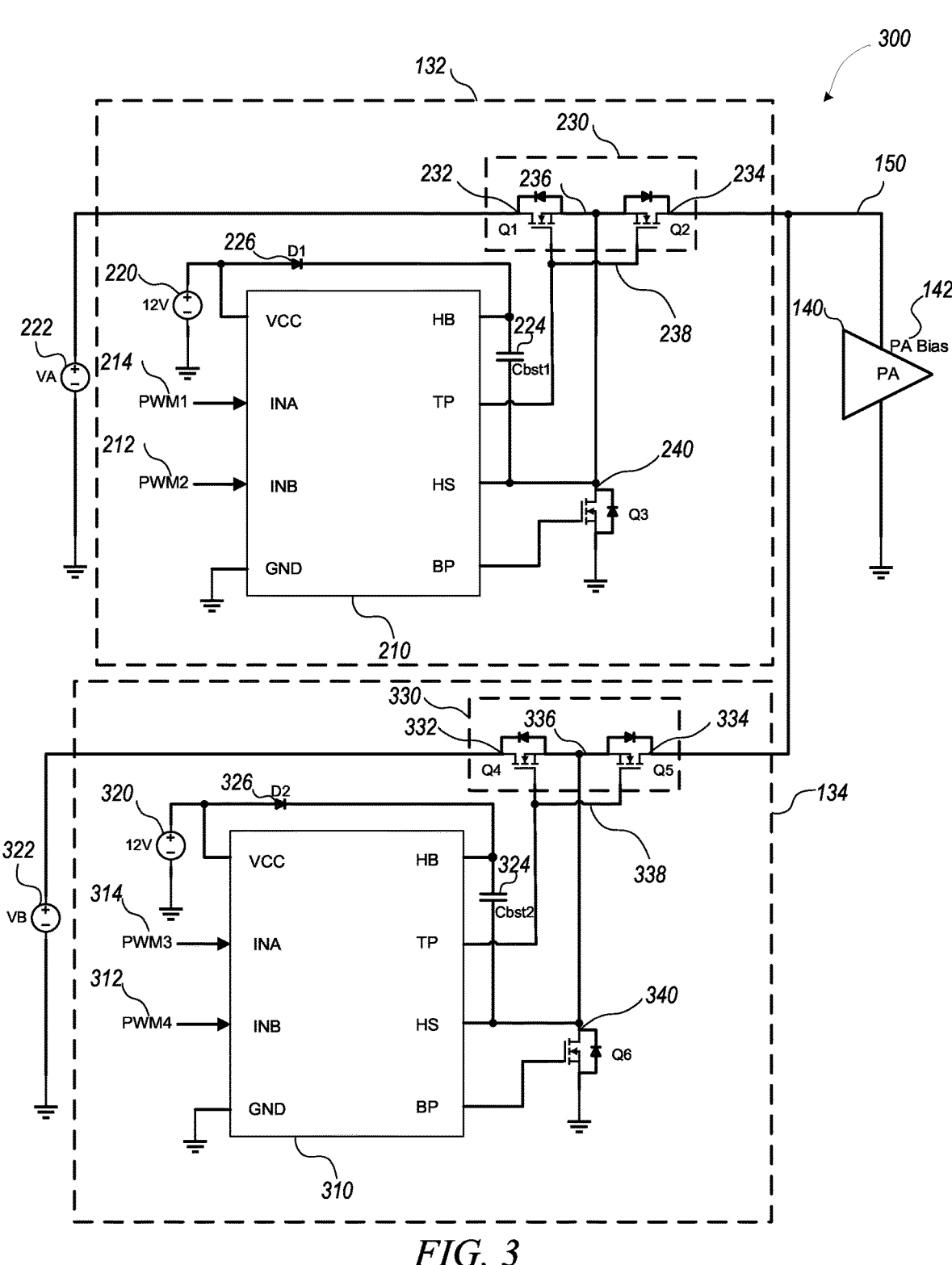
FIG. 3 is a schematic drawing of an example of portions of a power supply control system and an example of portions of a system in which the power supply control system can be used.

FIG. 3 is a schematic drawing 300 of an example of portions of a power supply control system 130 and an example of portions of a system 100 in which the power supply control system can be used. In the example of FIG. 3, the system 100 may include a first power supply 222, a third power supply 322, a first switch circuit 132, a second switch circuit 134, and a PA 140.

The second switch circuit 134 may include a second compound switch circuit 330, second voltage driving circuitry 310, a fourth power supply 320, a second diode 326, a second bootstrap capacitor 324, and a second DC switching device 340. The second compound switch circuit 330 may include a third FET 332 and a fourth FET 334. A source of the third FET 332 and a source of the fourth FET 334 may be connected together to form a second shared source node 336. A gate of the third FET 332 and a gate of the fourth FET 334 may be connected together to form a second shared gate node 338.

A drain of the third FET 332 may be connected to the third power supply 322. A drain of the fourth FET 334 may be connected to the output voltage supply node 150. The second voltage driving circuitry 310 may charge the second bootstrap capacitor 324 to the voltage of the fourth power supply 320 through the second diode 326 by turning on or modulating the second DC switching device 340. Following the charging of the second bootstrap capacitor 324, the second voltage driving circuitry 310 may stop charging the second bootstrap capacitor 324 and may then couple the second bootstrap capacitor 324 between the second shared source node 336 and the second shared gate node 338 to provide the "on" gate-to-source voltage of the second compound switch circuit 330. The third pulse-width modulation signal 314 and the fourth pulse-width modulation signal 312 may be received from a controller 160 through a controller bus 162. The components and operation of the second switch circuit 134 may be the same as or similar to the components of the first switch circuit 132, or they may differ in one or more ways.

The fourth power supply 320 and the second power supply 220 may be the same power supply. In an example, a single power supply output is shared between the fourth power supply 320 and the second power supply 220. This may help reduce one or more of the cost of the power supply control system 130, the size of the power supply control system 130, the weight of the power supply control system 130, or the power consumption of the power supply control system 130.

The power supply control system 130 may include N additional power supplies for switchably routing to the output voltage supply node 150, where N is an integer greater than or equal to 1, and i. is an integer index that is between 1 and N inclusive. The system 100, for a (3+2*i)th power supply, may include a (2+i)th compound switch circuit, (2+i)th voltage driving circuitry, a (4+2*i)th power supply, a (2+i)th diode, a (2+i)th bootstrap capacitor, and a (2+i)th DC switching device. The (2+i)th compound switch circuit may include a (3+2*i)th FET and a (4+2*i)th FET. A source of the (3+2*i)th FET and a source of the (4+2*i)th FET may be connected together to form a (2+i)th shared source node. A gate of the (3+2*i)th FET and a gate of the (4+2*i)th FET may be connected together to form a (2+i)th shared gate node.

A drain of the (3+2*i)th FET may be connected to the (3+2*i)th power supply. A drain of the (4+2*i)th FET may be connected to the output voltage supply node 150. The (2+i)th voltage driving circuitry may charge the (2+i)th bootstrap capacitor to the voltage of the (4+2*i)th power supply through the (2+i)th diode by turning on or modulating the (2+i)th DC switching device. Following the charging of the (2+i)th bootstrap capacitor, the (2+i)th voltage driving circuitry may stop charging the (2+i)th bootstrap capacitor and may then couple the (2+i)th bootstrap capacitor between the (2+i)th shared source node and the (2+i)th shared gate node to provide the "on" gate-to-source voltage of the (2+i)th compound switch circuit. The (3+2*i)th pulse-width modulation signal and the (4+2*i)th pulse-width modulation signal may be received from a controller 160 through a controller bus 162. The components and operation of the (2+i)th switch circuit may be the same as or similar to the components of the first switch circuit 132, or they may differ in one or more ways.

The fourth power supply 320, the second power supply 220 and the (4+2*i)th power supply may be the same power supply. This may help reduce one or more of the cost of the power supply control system 130, the size of the power supply control system 130, the weight of the power supply control system 130, or the power consumption of the power supply control system 130.

Figure 4:
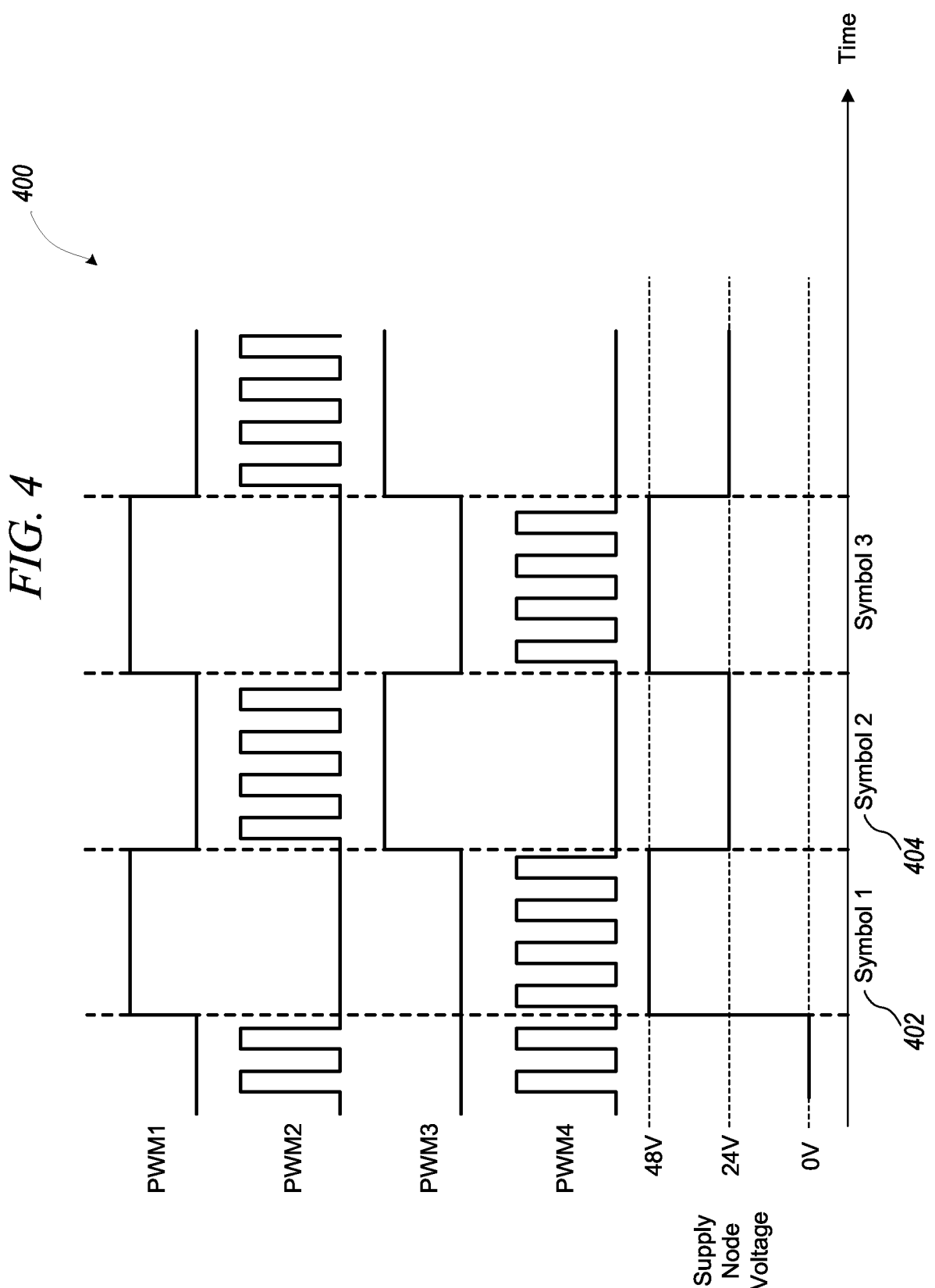
FIG. 4 is a graph in time showing an example of operating portions of a power supply control system.

FIG. 4 is a graph in time 400 showing an example of operating portions of a power supply control system 130. The example of FIG. 4 depicts the logical value of the first pulse-width modulation signal 214, the second pulse-width modulation signal 212, the third pulse-width modulation signal 314, the fourth pulse-width modulation signal 312, and the voltage of the output voltage supply node 150.

The power supply control system 130 may initially be in an idle mode, such as may follow a startup sequence. During the idle mode, the first pulse-width modulation signal 214 and the third pulse-width modulation signal 314 that control the power supply that is connected to the output voltage supply node 150 may both be off, which may result in the voltage going to the output voltage supply node 150 being 0V or near 0V. During the idle mode, the second pulse-width modulation signal 212 and the fourth pulse-width modulation signal 312 may be on or modulating between on and off to pre-charge the first bootstrap capacitor 224 and the second bootstrap capacitor 324 respectively.

The first bootstrap capacitor 224 and the second bootstrap capacitor 324 may have a low charge level prior to startup, and may not be able to provide the "on" gate to source voltage for the FETs until they are charged. In an example, the second pulse-width modulation signal 212 and fourth pulse-width modulation signal 312 may inversely mirror each other, with the second pulse-width modulation signal 212 being on while the fourth pulse-width modulation signal 312 is off and the second pulse-width modulation signal 212 being off while the 312 is on. This may one or more of reduce the load on the second power supply 220 and the fourth power supply 320, or reduce the load on a single power supply that charges both the first bootstrap capacitor 224 and the second bootstrap capacitor 324.

Following the idle mode, the power supply control system 130 may enter an operational mode. Upon entering the operational mode, a system 100 including the power supply control system 130 may be using a PA 140 to transmit a first symbol 402. The controller 160 may determine the power value of the first symbol 402 and select a 48V bias voltage, or the controller 160 may receive a signal indicating the power value of the first symbol 402 and select the 48V bias voltage. The second pulse-width modulation signal 212 may stop modulating and remain at a logical low value, and the first pulse-width modulation signal 214 may be set at a logical high value to place the first compound switch circuit 230 in an "on" state using the voltage of the first bootstrap capacitor 224. The output voltage supply node 150 may be connected through the first compound switch circuit 230 to the first power supply 222, which may have a voltage of 48V. This may result in a voltage of 48V or near 48V on the output voltage supply node 150, which may be connected to the PA power supply bias input 142. The fourth pulse-width modulation signal 312 may continue modulating to one or more of continue charging the second bootstrap capacitor 324 or maintain a charge level on the second bootstrap capacitor 324.

Following the first symbol 402, the power supply control system 130 may be configured for a second symbol 404. The second symbol may have a power value that may be transmitted using a 24V bias voltage. The first pulse-width modulation signal 214 may be set to a logical low level to turn off the first compound switch circuit 230. The fourth pulse-width modulation signal 312 may stop modulating and remain at a logical low value, and the third pulse-width modulation signal 314 may be set at a logical high value to turn on the second compound switch circuit 330 using the voltage of the second bootstrap capacitor 324. The output voltage supply node 150 may be connected through the second compound switch circuit 330 to the third power supply 322, which may have a voltage of 24V. This may result in a voltage of 24V or near 24V on the output voltage supply node 150, which may be connected to the PA power supply bias input 142. The second pulse-width modulation signal 212 may resume modulating to one or more of resume charging the first bootstrap capacitor 224 or maintain a charge level on the second bootstrap capacitor 324.

Any overlap between switching of the first compound switch circuit 230, the second compound switch circuit 330, the first DC switching device 240, and the second DC switching device 340 may avoid damage to the power supply control system 130. Providing a non-overlap or keeping the overlap short in time may help prevent damaging heat from building in the power supply control system 130. The fourth pulse-width modulation signal 312 may be set to a logical high value simultaneously with the second pulse-width modulation signal 212 being set to a logical low level, or the fourth pulse-width modulation signal 312 may be set to a logical high value slightly before or after the second pulse-width modulation signal 212 being set to a logical low level. The PA power supply bias input 142 may temporarily drop below a desired bias level during switching between symbols. In an example, the first pulse-width modulation signal 214 and the third pulse-width modulation signal 314 may be generated from bits in a register that is configured so that only a single bit can be at a logical high value at one time. This may prevent overlap between the first pulse-width modulation signal 214 and the third pulse-width modulation signal 314.

The symbols to be transmitted may have an average length, which may establish a maximum frequency of the symbols being transmitted. In an example, the symbol frequency may include one or more of 5 megahertz, 10 megahertz, 20 megahertz, 50 megahertz, or 100 megahertz. The symbol frequency may exceed 20 megahertz, corresponding to an average symbol length of approximately 50 nanoseconds or less. The power supply control system 130 may provide a different bias voltage condition for each of the symbols, resulting in a power supply control system 130 switching frequency approximately equal to the symbol frequency. The power supply control system 130 may provide the same bias voltage condition for one or more symbols in a row, resulting in a power supply control system 130 switching frequency that is less than the symbol frequency.

Figure 5:
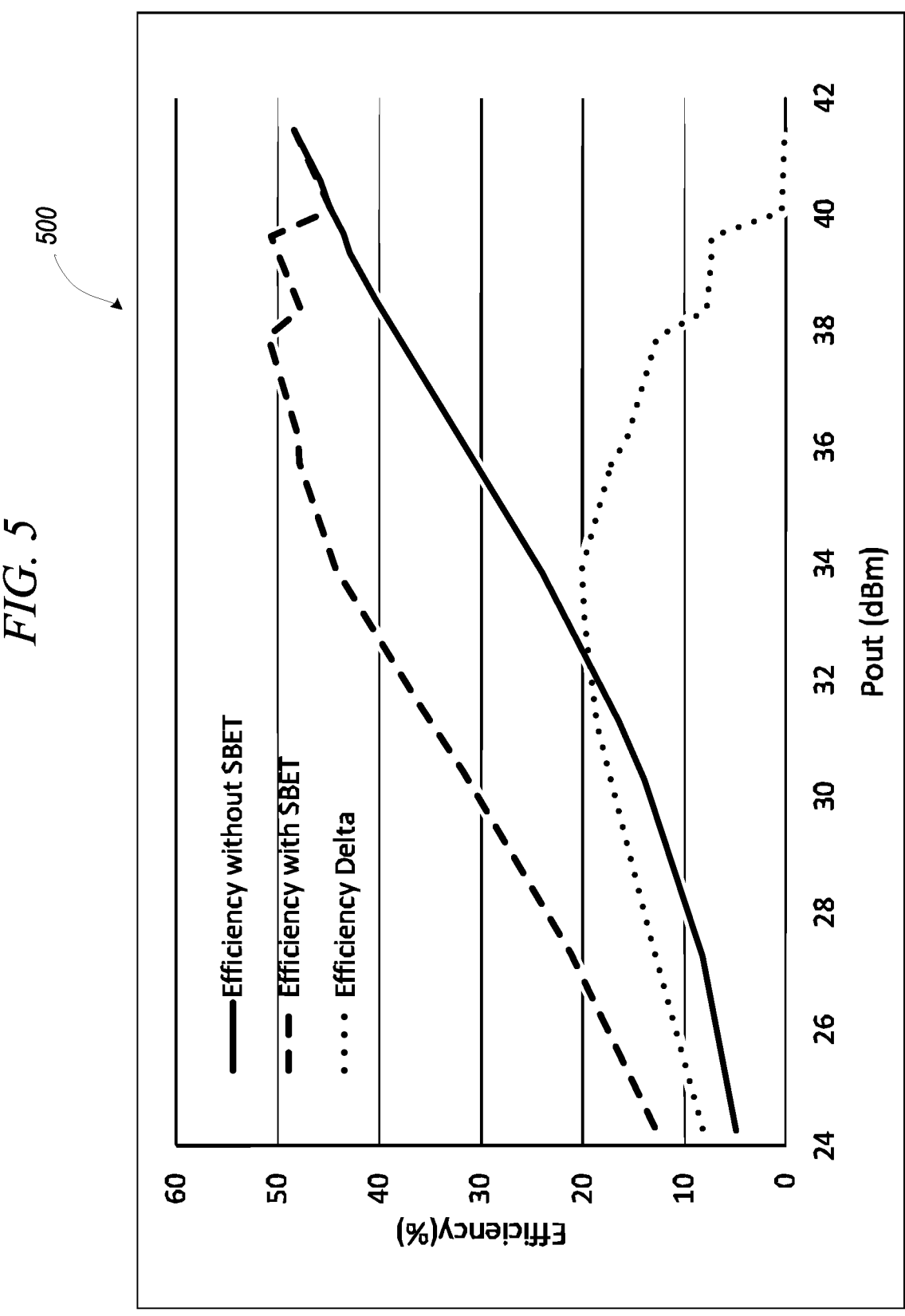
FIG. 5 is a graph showing an example of the operation of portions of a power supply control system.

FIG. 5 is a graph 500 showing an example of the operation of portions of a power supply control system 130. FIG. 5 shows laboratory-recorded efficiency results for a system symbol-based envelope tracking (SBET) and similar system that is not using SBET. The efficiency difference between the two systems is also shown. In the example of FIG. 5, the SBET used 4 PA bias levels on the output voltage supply node 150—24V, 32V, 40V, and 48V.

For low power output levels, around 24 dBm, the efficiency of both the system with SBET and the system without SBET were relatively low, but there was an approximately 8% increase in efficiency with SBET. For medium power output levels, around 32-34 dBm, The efficiency increase was around 20% for the system using SBET. This may have been the peak efficiency increase because the 24V SBET bias voltage was operating at maximum efficiency, while the 48V bias for the non-SBET system was operating below maximum efficiency. For high power output levels, 40-42 dBm, the efficiency of both systems were approximately the same. This may be due to the SBET system applying the same bias level as the non-SBET system.

FIG. 6 is a flow chart 600 showing an example of a method for operating portions of a power supply control system 130. At 602—a first bootstrap capacitor and a second bootstrap capacitor, respectively corresponding to first and second input dc sources, may be charged. At 604—a first input DC source may be selected, the first bootstrap capacitor may stop being charged, and then the first bootstrap capacitor may be coupled across the source and gate of a first pair of field effect transistors (FETs) with their sources connected, arranged in series between the first input DC source and the output DC supply source, while the second bootstrap capacitor continues to be charged. At 606—the second input DC source may be selected, the first bootstrap capacitor may be decoupled from the first pair of FETs, the first bootstrap capacitor may resume being charged, the second bootstrap capacitor may stop being charged, and then the second bootstrap capacitor may be coupled across the source and gate of a second pair of FETs with their sources connected, arranged in series between the second input DC source and the output DC supply. The shown order of steps is not intended to be a limitation on the order the steps are performed in. In an example, two or more steps may be performed simultaneously or at least partially concurrently.

The method of flow chart 600 may also include selecting between one or more additional input DC sources. The input DC sources may be one or more of current sources or voltage sources. The bootstrap capacitors may be charged by DC power supplies with a ground reference or without a ground reference. The bootstrap capacitors may be charged by separate DC power supplies or by the same DC power supply. The input DC source for output may be selected by a controller 160, and may be selected based upon one or more of a symbol value, symbol power, or necessary PA vias voltage to transmit a symbol.

The systems and methods described herein are believed to apply to a single power supply level system, a two power supply level system, and an N power supply level system.

The system with N power supplies may route a selected one of the N power supplies to the output. The system with N power supplies may be configured similarly to FIG. 1. The system with N power supplies may route the selected one of the N power supplies to the output using the method of FIG. 6.

The addition of more input sources may result in an increased power load, such as may be due to one or more of the non-isolated DC-DC converter 120, the charging of bootstrap capacitors, or the power loss in the voltage driving circuitry. The number of input sources may be selected at least in part by weighing the increase in efficiency of an additional input source against the decrease in efficiency due to the additional switching system for the additional input source. The number of input sources may be selected at least in part by weighting in increase in efficiency of an additional input source against the decrease in efficiency due to the additional output from the non-isolated DC-DC converter 120.

The addition of more input sources may result in one or more of an increased cost or size of the system 100, such as may be due to additions to the non-isolated DC-DC converter 120 or additions to the power supply control system 130. In an example, the number of input sources may be selected based at least in part based on considerations of one or more of the size and cost of the non-isolated DC-DC converter 120 and/or the power supply control system 130.

The systems, techniques, and methods described herein are believed to apply, at least in part, to the routing or switching of a variety of power supplies and power sources. The present disclosure may apply to DC systems, AC systems, signal and function generators, signal chains, and other systems. The present disclosure may apply to current and voltage supplies and sources.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A power supply control system for switchably routing at least a first power supply voltage to an output voltage supply node, the system comprising:
    a first compound switch circuit comprising:
        a first field effect transistor (FET), wherein a drain of the first FET is connected to the first power supply voltage; and
        a second FET, wherein a source of the second FET is connected to a source of the first FET, wherein a drain of the second FET is connected to the output voltage supply node, wherein a gate of the first FET and a gate of the second FET are connected together to form a first shared source node;
    first voltage driving circuitry to drive an "on" gate-to-source voltage level of the first compound switch above a turn-on gate-to-source voltage of the first and second FETs when the first compound switch is to be placed in an "on" state; and
    a first bootstrap capacitor, configured to be pre-charged to a second power supply voltage when the first compound switch is in an "off" state, and configured to provide the second power supply voltage as the "on" gate-to-source voltage level to the first voltage driving circuitry when the first compound switch is to be placed in the "on" state.

2. The system of claim 1, wherein the second power supply voltage and the first power supply voltage share a common ground reference.

3. The system of claim 1, wherein the system is further configured for switchably routing a third power supply voltage to the output voltage supply node, the system further comprising:
    a second compound switch circuit comprising:
        a third FET wherein a drain of the first FET is connected to the third power supply voltage; and
        a fourth FET, wherein a source of the fourth FET is connected to a source of the third FET, wherein a drain of the fourth FET is connected to the output voltage supply node, wherein a gate of the third FET and a gate of the fourth FET are connected together to form a second shared source node;
    second voltage driving circuitry to drive an "on" gate-to-source voltage level of the second compound switch above a turn-on gate-to-source voltage of the third and fourth FETs when the second compound switch is to be placed in an "on" state; and
    a second bootstrap capacitor, configured to be pre-charged to a fourth power supply voltage when the second compound switch is in an "off" state, and configured to provide the fourth power supply voltage as the "on" gate-to-source voltage level to the second voltage driving circuitry when the second compound switch is to be placed in the "on" state.

4. The system of claim 3, wherein the system is further configured for switchably routing N additional power supply voltages to the output voltage supply node, wherein N is an integer greater than or equal to 1, and i is an integer index that is between 1 and N inclusive, the system, for a (3+2*i)th power supply voltage, further comprising:
    a (2+i)th compound switch circuit comprising:
        a (3+2*i)th FET wherein a drain of the (3+2*i)th FET is connected to the (3+2*i)th power supply voltage; and
        a (4+2*i)th FET, wherein a source of the (4+2*i)th FET is connected to a source of the (3+2*i)th FET, wherein a drain of the (4+2*i)th FET is connected to the output voltage supply node, wherein a gate of the (3+2*i)th FET and a gate of the (4+2*i)th FET are connected together to form a (2+i)th shared source node;
    (2+i)th voltage driving circuitry to drive an "on" gate-to-source voltage level of the (2+i)th compound switch above a turn-on gate-to-source voltage of the (3+2*i)th and (4+2*i)th FETs when the (2+i)th compound switch is to be placed in an "on" state; and
    a (2+i)th bootstrap capacitor, configured to be pre-charged to a (4+2*i)th power supply voltage when the (2+i)th compound switch is in an "off" state, and configured to provide the (4+2*i)th power supply voltage as the "on" gate-to-source voltage level to the (2+i)th voltage driving circuitry when the (2+i)th compound switch is to be placed in the "on" state.

5. The system of claim 3 wherein the second power supply voltage and the fourth power supply voltage are generated by a common bootstrap charging power supply voltage, and wherein the bootstrap charging power supply voltage, the first power supply voltage, and the third power supply voltage share a common ground reference.

6. The system of claim 3, further comprising a controller to sequence the charging of the bootstrap capacitors and selection of the power supply voltage for output to the output voltage supply node.

7. The system of claim 3, wherein the output voltage supply node is electrically connected to provide a bias voltage to a power amplifier (PA) and is at least one of specified or changed based upon a value or a change in value of a symbol to be communicated.

8. The system of claim 3, wherein a frequency of switching between the first power supply voltage and the third power supply voltage exceeds 20 megahertz.

9. The system of claim 1, wherein the first voltage driving circuitry further comprises a first DC switching device, wherein the first DC switching device is turned "on" to charge the first bootstrap capacitor.

10. The system of claim 1, wherein the output voltage supply node is used to bias a power amplifier (PA).

11. The system of claim 10, further comprising the PA, and wherein the PA is used in a cellular transmitter.

12. A circuit for biasing a power amplifier (PA), the circuit comprising:

a DC power supply, wherein the DC power supply provides two or more DC voltage levels;

a DC switch system for switchably routing one of the two or more DC voltage levels at a time to an output voltage supply node, wherein the DC switch system comprises:

a switch circuit for each of the two or more DC voltage levels, the switch circuit for each DC voltage level comprising:

a compound switch circuit comprising:

a first field effect transistor (FET), wherein a drain of the first FET is connected to a respective DC voltage level; and a second FET, wherein a source of the second FET is connected to a source of the first FET, wherein a drain of the second FET is connected to the output voltage supply node, wherein a gate of the first FET and a gate of the second FET are connected together to form a first shared source node;

voltage driving circuitry to drive an "on" gate-to-source voltage level of the compound switch above a turn-on gate-to-source voltage of the first and second FETs when the compound switch is to be placed in an "on" state; and a bootstrap capacitor, configured to be pre-charged to a bootstrap charging power supply voltage when the compound switch is in an "off" state, and configured to provide the bootstrap charging power supply voltage as the "on" gate-to-source voltage level to the voltage driving circuitry when the compound switch is to be placed in the "on" state.

13. The circuit of claim 12, wherein the bootstrap charging power supply voltage is shared by the switch circuits for each of the two or more DC voltage levels, and wherein the bootstrap charging power supply shares a common ground reference with the two or more DC voltage levels.

14. The circuit of claim 12, wherein the PA is used in a cellular transmitter.

15. The circuit of claim 14, further comprising a controller, wherein the controller is configured to select between the two or more DC voltage levels based upon the power of a symbol to be transmitted.

*       *       *       *       *